(12) United States Patent
Roisen et al.

(10) Patent No.: US 9,087,279 B2
(45) Date of Patent: Jul. 21, 2015

(54) BOARD TEST SYSTEM AND METHOD

(71) Applicant: Horse Sense Shoes, LLC, Plymouth, MN (US)

(72) Inventors: Roger Roisen, Minnetrista, MN (US); Michael McHugh, Plymouth, MN (US)

(73) Assignee: Horse Sense Shoes, LLC, Plymouth, MN (US)

( * ) Notice: Subject to any disclaimer, the term of this patent is extended or adjusted under 35 U.S.C. 154(b) by 0 days.

(21) Appl. No.: 14/212,984

(22) Filed: Mar. 14, 2014

(65) Prior Publication Data

US 2014/0263613 A1 Sep. 18, 2014

Related U.S. Application Data

(60) Provisional application No. 61/793,792, filed on Mar. 15, 2013.

(51) Int. Cl.
*G06K 19/07* (2006.01)
*G01R 31/302* (2006.01)
*G01R 31/28* (2006.01)

(52) U.S. Cl.
CPC ........ *G06K 19/0723* (2013.01); *G01R 31/3025* (2013.01); *G01R 31/2818* (2013.01)

(58) Field of Classification Search
USPC ........................................................ 235/375
See application file for complete search history.

(56) References Cited

U.S. PATENT DOCUMENTS 7,395,474 B2 * 7/2008 Maltseff et al. ............... 714/733
2011/0022524 A1 * 1/2011 Monahan ...................... 705/302

* cited by examiner

*Primary Examiner* — Christie I Marshall
(74) *Attorney, Agent, or Firm* — Schwegman Lundberg & Woessner, P.A.

(57) ABSTRACT

A system includes a microprocessor that executes microcode designed to query all or some of the electronic circuits that are on a device under test. The results of the query are written to an RFID IC register. The RFID IC is queried by an interrogator to obtain test results.

3 Claims, 3 Drawing Sheets

BOARD TEST SYSTEM AND METHOD

RELATED APPLICATION

This application claims priority to U.S. Patent Application Ser. No. 61/793,792 (entitled BOARD TEST SYSTEM AND METHOD, filed Mar. 15, 2013) which is incorporated herein by reference.

BACKGROUND

Prior systems test board level electronic circuits via a "bed of nails" or "pogo-pins" system that typically involve probing a card with contacts that allow for electrical connection to the device under test. (DUT) The DUT is stimulated with electronic signals from automated test equipment (ATE) device that has sensitive metering and precision waveform generation capabilities. This results in high cost in test equipment and fixture complexity. The test time associated with this process is slow and costly.

SUMMARY

A test system for use in measuring electrical properties and determining a pass/fail of a device under test (DUT) and the point of failure in an electronic circuit board is described. The DUT using a state machine within a microprocessor provides the analysis tool via embedded microcode to run built in diagnostics on the DUT during fabrication. The microprocessor then writes the test results to a radio frequency identification (RFID) integrated circuit (IC) which is interrogated via a radio frequency (RF) signal to provide results for the DUT.

DETAILED DESCRIPTION

In the following description, reference is made to the accompanying drawings that form a part hereof, and in which is shown by way of illustration specific embodiments which may be practiced. These embodiments are described in sufficient detail to enable those skilled in the art to practice the invention, and it is to be understood that other embodiments may be utilized and that structural, logical and electrical changes may be made without departing from the scope of the present invention. The following description of example embodiments is, therefore, not to be taken in a limited sense, and the scope of the present invention is defined by the appended claims.

The functions or algorithms described herein may be implemented in software or a combination of firmware and human implemented procedures in one embodiment. The firmware may consist of computer executable instructions stored in flash or FRAM memory. Further, such functions correspond to modules, which are software, hardware, firmware or any combination thereof. Multiple functions may be performed in one or more modules as desired, and the embodiments described are merely examples. The software may be executed on a digital signal processor, ASIC, microprocessor, or other type of processor operating on a computer system, such as a personal computer, server or other computer system.

Various embodiments include one or more microcontrollers or digital signal processors that execute built in self-test algorithms to determine device under test (DUT) status.

In one embodiment, an RFID IC such as the Ramtron WM70016 integrated circuit which contains non-volatile RAM and 917 Mhz radio, is placed on a device under test during the design phase of the final product. The microprocessor executes the embedded microcode to test for continuity to all circuitry on the device under test. The microprocessor such as an MSP4302274RHAT then writes a test code to the specific register within the RFID IC that indicates the results of the test, such as a pass/fail indication. The test code may also indicate what failed. In some embodiments, the test code may indicate a list of functions that passed of failed, which may be used to sort the device into different bins for different end applications. This is useful to increase yield, as some applications may not require the device to perform certain functions. If those certain functions failed, it would not affect the operation of the device in such applications.

Figure 1:
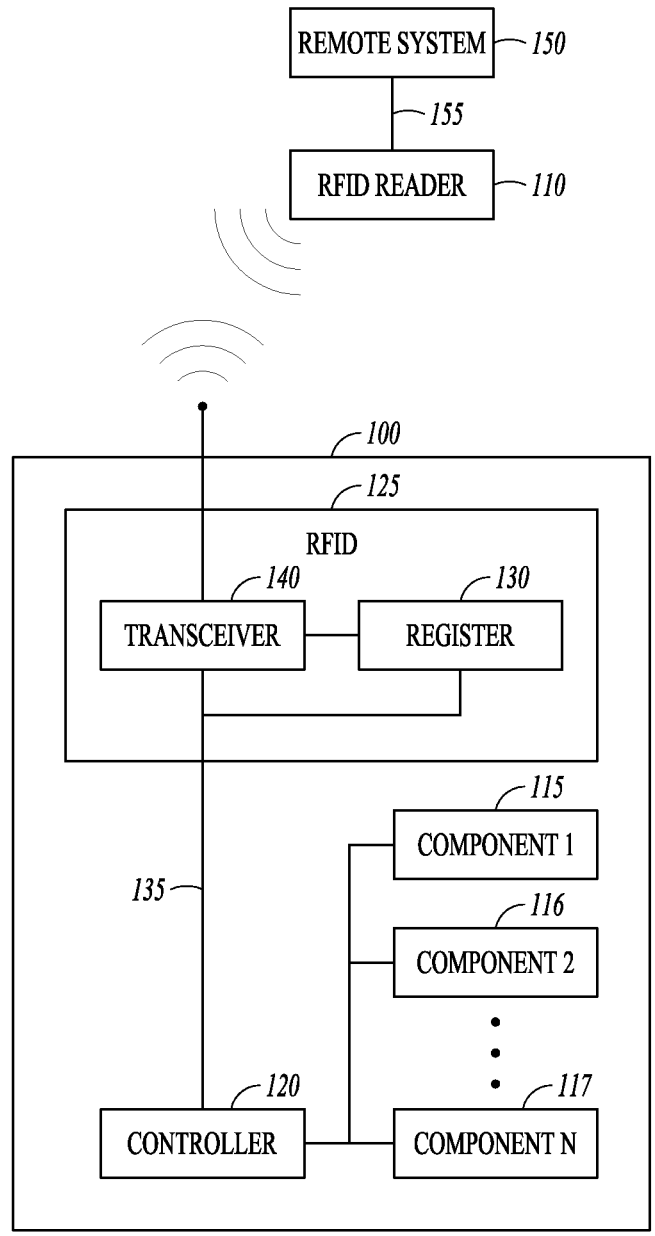
FIG. 1 is a block schematic diagram of a device under test according to an example embodiment.

FIG. 1 is a block schematic diagram illustrating a device under test 100 and a system 110 for reading the device under test. Device 100 in one embodiment is circuit card that is being manufactured and is ready for one or more tests. The circuit card may contain multiple circuitry components indicated at 115, 116, and 117 for example. In various embodiments, the components may include circuitry and sensors. A controller 120, such as a state machine is coupled to the components and may query the components to obtain test results. In further embodiments, the controller 120 may perform tests on the components. The queries and/or tests may be downloaded into the controller via a wired test pin like connection or wirelessly in some embodiments. In some embodiments, some or all test functionality may also be implemented directly on each component, providing result information to the controller 120 responsive to queries.

Controller 120 is coupled to an RFID chip 125 that includes a register 130 for storing results of the test received from controller 120 via a bus 135. The controller 120 may also optionally be coupled to a transceiver 140 that reads the register 130 and transmits the results in the register when activated and powered via RFID reader 110. In one embodiment, the reader 110 and RFID chip 125 including transceiver 140 operates at 917 MHz. When the RFID reader 110 sends an interrogation signal, the interrogation signal provides power to the transceiver, which reads the test results from the register 130 and transmits the test results back to the RFID reader 110.

In one embodiment, the RFID reader is coupled to a remote system 150 via a wired or wireless connection 155. The test results may also contain a unique ID that the remote system utilizes to obtain further information about the device under test 100. The further information may be utilized to identify a bin for the device 100, and may further be tied back in to manufacturing line systems to provide information to allow such systems to properly route and perform further operations on the device. In further embodiments, remote system 150 is coupled to shipping systems to provide shipping and billing information to ship the device to a purchaser and invoice the purchaser. In some embodiments, the remote system 150 may be hosted in a cloud type environment and may include an enterprise resource management system.

Figure 2:
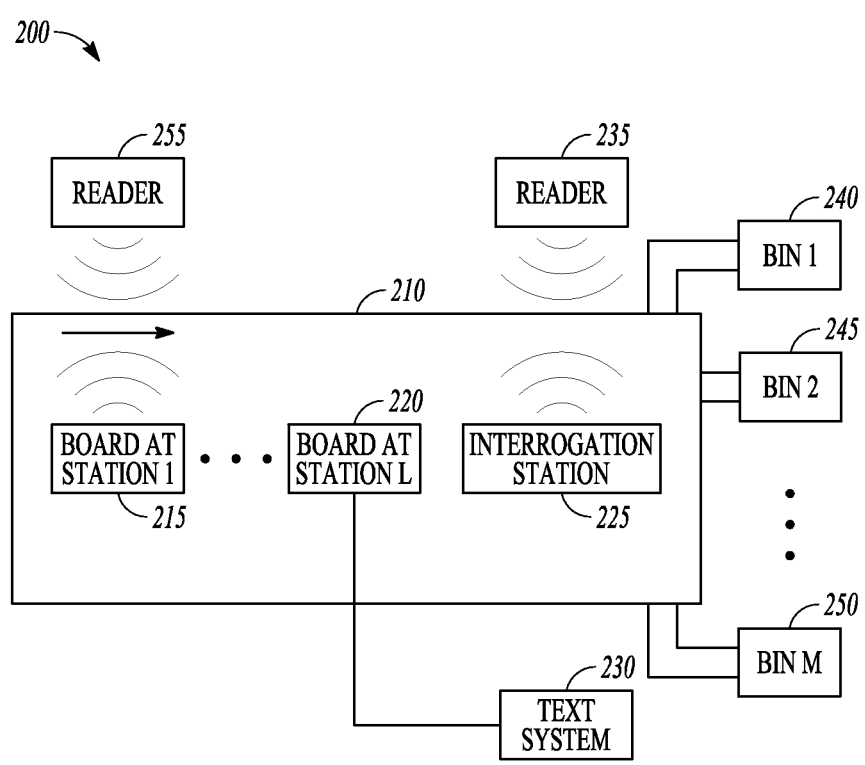
FIG. 2 is a block schematic diagram of a manufacturing line having and RFID interrogator according to an example embodiment.

FIG. 2 is a block schematic diagram illustrating a manufacturing environment 200 according to an example embodiment. A conveyor belt 210 may be used in one embodiment to convey a device being manufactured to one or more stations 215, 220, 225. Different operations may occur at different stations, including attaching one or more components to a circuit board comprising the device to be manufactured. Station 220 is a final test station in one embodiment, and may be coupled to a test system 230 to initiate self-testing by the board being manufactured. The test system 230 may also load testing code into the board controller 120 via a wired or wireless connection.

Following completion of the test, an RF reader positioned proximate the board at an interrogation station 225 on the line 210 interrogates the RFID chip 125 to obtain the test results. Based on the test results, the board may be transferred to one of M bins as indicated at 240, 245, and 250. For example, if the board passes all tests, it may be routed to bin 1 at 240. If one subset of tests are passed, the board may be routed to bin 2 at 245. If a bin fails one or more tests related to components or functions that are required for all purchasers, the board may be rated fail, and sent to a fail bin, such as bin M at 250. Failed boards may be recycled or disposed of. By sorting the boards into various bins based on passed and failed tests, the overall yield of the manufacturing process may be increased.

During manufacture at the various stations, the RFID chip on the board may also be interrogated via a reader 255 for a board ID stored in one or more registers. The ID may be used to control manufacturing operations, allowing more than one type of board to be manufactured on a line without having to manually scan a code using a bar code reader. Still further, intermediate tests may be performed at other stations and communicated to RFID readers.

Figure 3:
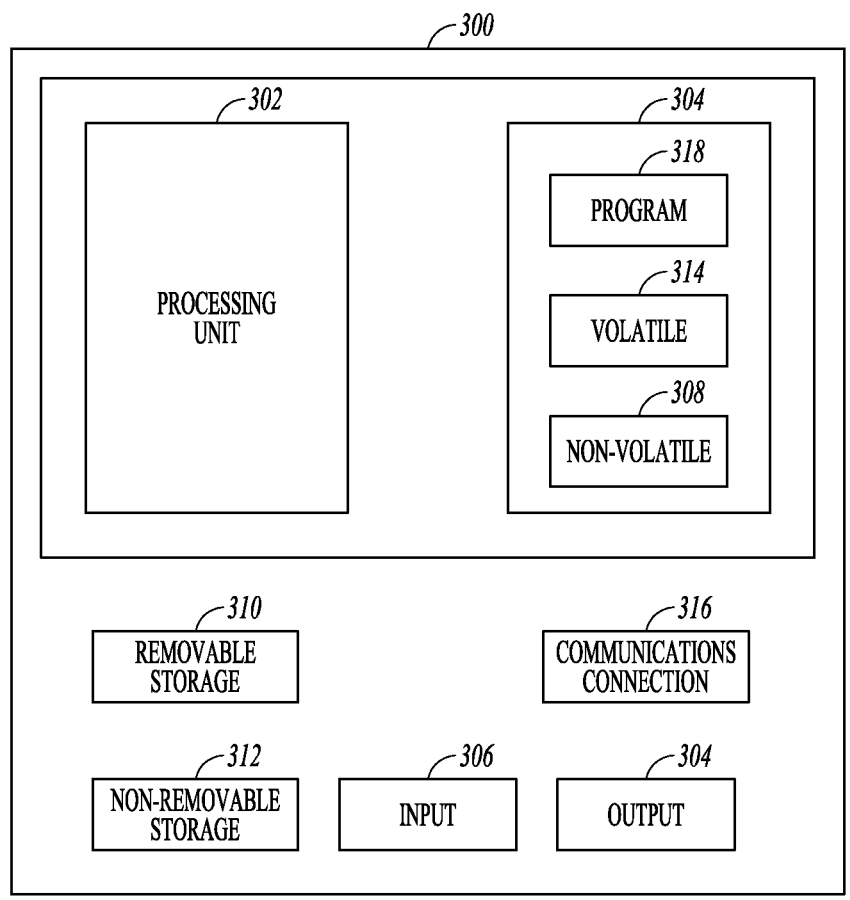
FIG. 3 is a block schematic diagram of a computer system for implementing one or more controllers and computer systems according to an example embodiment.

FIG. 3 is a block diagram of a computing device 300 for implementing one or more controllers, computer systems and methods, according to an example embodiment. The processors described in some of the above embodiments may include more or fewer components than those shown at 300. Example processors include an 8051 microprocessor or other similar processor. In one embodiment, multiple such computer systems are utilized in a distributed network to implement multiple components in a transaction based environment. An object-oriented, service-oriented, or other architecture may be used to implement such functions and communicate between the multiple systems and components. One example computing device in the form of a computer 310, may include a processing unit 302, memory 304, removable storage 312, and non-removable storage 314. Memory 304 may include volatile memory 306 and non-volatile memory 308. Computer 310 may include—or have access to a computing environment that includes—a variety of computer-readable media, such as volatile memory 306 and non-volatile memory 308, removable storage 312 and non-removable storage 314. Computer storage includes random access memory (RAM), read only memory (ROM), erasable programmable read-only memory (EPROM) & electrically erasable programmable read-only memory (EEPROM), flash memory or other memory technologies, compact disc read-only memory (CD ROM), Digital Versatile Disks (DVD) or other optical disk storage, magnetic cassettes, magnetic tape, magnetic disk storage or other magnetic storage devices, or any other medium capable of storing computer-readable instructions. Computer 310 may include or have access to a computing environment that includes input 316, output 318, and a communication connection 320. The computer may operate in a networked environment using a communication connection to connect to one or more remote computers, such as database servers. The remote computer may include a personal computer (PC), server, router, network PC, a peer device or other common network node, or the like. The communication connection may include a Local Area Network (LAN), a Wide Area Network (WAN) or other networks.

Computer-readable instructions stored on a computer-readable medium are executable by the processing unit 302 of the computer 310. A hard drive, CD-ROM, and RAM are some examples of articles including a non-transitory computer-readable medium. For example, a computer program 325 capable of providing a generic technique to perform access control check for data access and/or for doing an operation on one of the servers in a component object model (COM) based system according to the teachings of the present invention may be included on a CD-ROM and loaded from the CD-ROM to a hard drive. The computer-readable instructions allow computer 310 to provide generic access controls in a COM based computer network system having multiple users and servers.

EXAMPLE

1. A device comprising:
a printed circuit board;
a plurality of components mounted on the printed circuit board, the components including built in self-test functionality; and
an RFID having a writable register to store and provide a result of a test of the printed circuit board.
2. The device of example 1 wherein the RFID register further stores a unique ID of the printed circuit board.
3. The device of example 2 wherein at least a portion of the RFID register is read only, such portion storing the unique ID of the printed circuit board.
4. The device of any of examples 1-3 wherein the RFID register is a first in first out buffer.
5. The device of any of examples 1-4 and further comprising a controller coupled to the components, the controller further comprising programming to obtain test results from the components and to provide test results to the RFID register.
6. The device of example 5 wherein the controller is adapted to query components to obtain test results.
7. The device of any of examples 5-6 wherein the controller is adapted to test the components to obtain test results.
8. The device of any of examples 5-7 wherein the controller is further adapted to couple to a remote test system to receive test code to test the components.
9. A device comprising:
a plurality of components;
a controller coupled to the plurality of components to test the components; and
an RFID chip coupled to the controller having a writable register to receive test results from the controller and to provide the test results when interrogated by an RFID reader.
10. The device of example 9 wherein the RFID register further stores a unique ID of the printed circuit board.
11. The device of example 10 wherein at least a portion of the RFID register is read only, such portion storing the unique ID of the device.
12. The device of any of examples 9-11 wherein the RFID register is a first in first out buffer.
13. The device of any of examples 9-12 wherein the controller is further adapted to couple to a remote test system to receive test code to test the components.
14. The device of any of examples 9-13 wherein the device comprises a printed circuit board and the components comprise circuitry.

15. The device of example 14 wherein the controller comprises a programmable state machine.

16. A method comprising:
testing a device;
storing results of the test; and
writing the results of the test into an RFID register wherein the results are provided via an RFID chip coupled to the register when read by an RFID reader.

17. The method of example 16 and further comprising reading the results from the RFID register and sorting the device based on the read results.

18. The method of example 17 wherein testing the device utilizes built in self-test functionality.

19. The method of example 18 wherein the device comprises a printed circuit board.

The following statements are provided as examples, of various embodiments.

The invention claimed is:

1. A method comprising:
testing a device;
storing results of the test;
writing the results of the test into an RFID register wherein the results are provided via an RFID chip coupled to the register when read by an RFID reader;
reading the results;
routing devices passing all test results to a first bin;
determining a subset of test results passed from test results including a failed test;
identifying a purchaser for devices passing the subset of test results; and
routing devices passing the subset to a second bin.

2. The method of claim 1 wherein testing the device utilizes built in self-test functionality.

3. The method of claim 2 wherein the device comprises a printed circuit board.

* * * * *